(12) United States Patent
Seo

(10) Patent No.: US 7,813,200 B2
(45) Date of Patent: Oct. 12, 2010

(54) SENSE AMPLIFIER CONTROL CIRCUIT FOR SEMICONDUCTOR MEMORY DEVICE AND METHOD FOR CONTROLLING SENSE AMPLIFIER CONTROL CIRCUIT

(75) Inventor: Ju-Young Seo, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 174 days.

(21) Appl. No.: 12/217,044

(22) Filed: Jun. 30, 2008

(65) Prior Publication Data
US 2009/0268529 A1 Oct. 29, 2009

(30) Foreign Application Priority Data
Apr. 24, 2008 (KR) ................. 10-2008-0038102

(51) Int. Cl.
*G11C 7/22* (2006.01)
(52) U.S. Cl. .................. 365/205; 365/194; 365/196
(58) Field of Classification Search ........... 365/196
See application file for complete search history.

(56) References Cited

U.S. PATENT DOCUMENTS 6,259,640 B1 * 7/2001 Endo et al. ............. 365/201
2008/0123453 A1 * 5/2008 Seo ...................... 365/205

FOREIGN PATENT DOCUMENTS

KR 10-1999-0057717 7/1999
KR 10-2002-0055160 A 7/2002

* cited by examiner

*Primary Examiner*—Tan T. Nguyen
(74) *Attorney, Agent, or Firm*—Blakely, Sokoloff, Taylor & Zafman

(57) ABSTRACT

A sense amplifier control circuit for a memory device is provided. The sense amplifier control circuit for a memory device including: a level detection unit configured to generate a level detection signal by detecting a core voltage level in an active operation interval; and a control unit configured to generate a pulse signal to control a sensing start time of a bit line detection signal by varying a delay time according to the level detection signal.

22 Claims, 5 Drawing Sheets

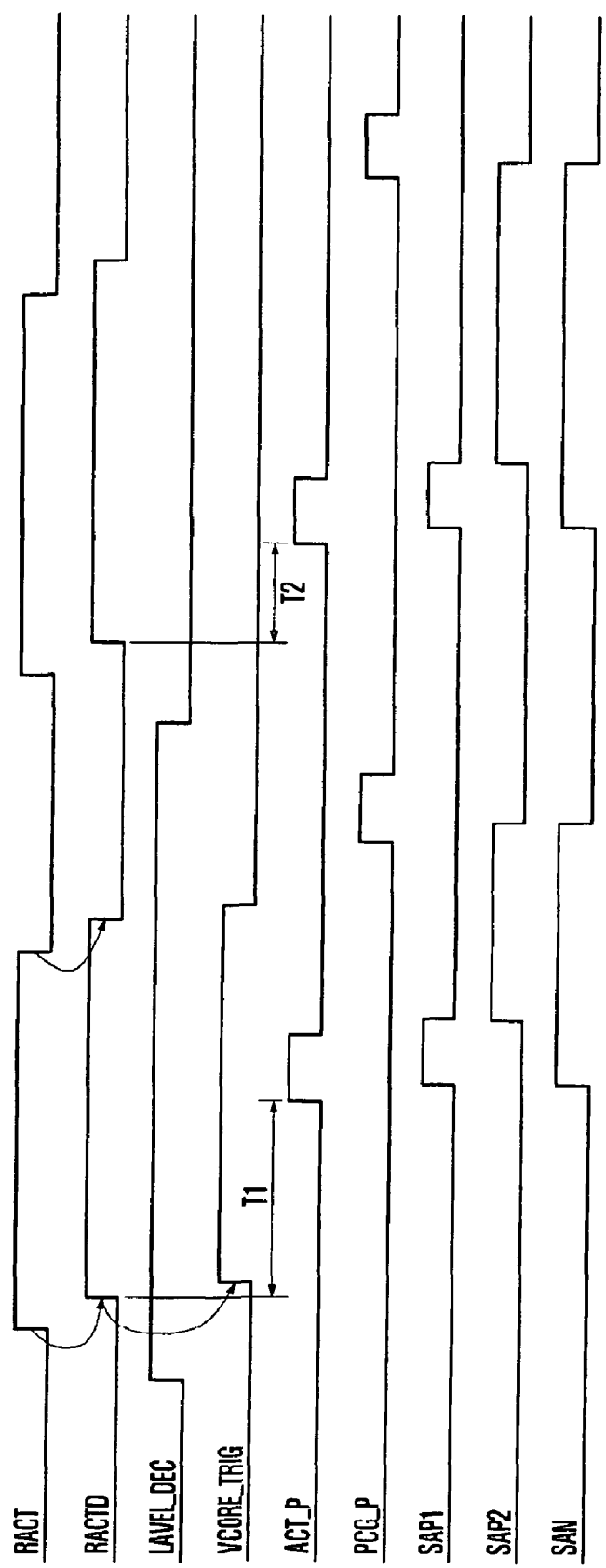

SENSE AMPLIFIER CONTROL CIRCUIT FOR SEMICONDUCTOR MEMORY DEVICE AND METHOD FOR CONTROLLING SENSE AMPLIFIER CONTROL CIRCUIT

CROSS-REFERENCE(S) TO RELATED APPLICATIONS

The present invention claims priority of Korean patent application number 10-2008-0038102, filed on Apr. 24, 2008, which is incorporated by reference in its entirety.

BACKGROUND OF THE INVENTION

The present invention relates to sense amplifier control, and more particularly, to a memory device sense amplifier control circuit for controlling a sensing start time of bit lines using a detected core voltage level, and a method for controlling the sense amplifier control circuit.

Generally, memory devices, such as a dynamic random access memory (DRAM), include memory cells each having a transistor and a capacitor. Data are stored in the capacitors of the memory cells. Each capacitor is formed on a semiconductor substrate but not completely isolated such that the capacitor is discharged (that is, data are not retained). In other words, data stored in the memory cells can be deleted due to current leakage. Therefore, the memory devices should be periodically refreshed so as to maintain charges of the capacitors.

In refresh mode, a memory device performs a refresh operation in response to an external command by sequentially accessing memory cells based on internal addresses. That is, when the memory device enters refresh mode in response to an external command, word lines of the memory cells are selected by periodically increasing low addresses in sequence. Charges stored in capacitors corresponding to the selected word line are amplified by a sense amplifier and are stored in the capacitors again. Owing to these refreshing procedures, data stored in the memory device can be retained.

Memory devices produce necessary internal voltages using an external power voltage having an upper voltage-level limit. In the case of a DRAM using a bit line sense amplifier, a core voltage VCORE is produced to amplify cell data. When a word line is active, data stored in a plurality of memory cells connected to the word line are transmitted to a bit line, and then the bit line sense amplifier senses and amplifies a voltage difference between a bit line pair.

As explained above, a voltage is applied to a bit line or an inverse bit line by a sense amplifier so as to charge capacitors of memory cells for storing data in the memory cells. The voltage is defined as a core voltage, and an internal driver generating the core voltage is called a core voltage driver. As DRAMs operate more rapidly, more rapid sensing is required, and thus the core voltage is required to be adjusted for rapid charging. Therefore, an overdriving method is used to disconnect the core voltage from an external power voltage VDD higher than the core voltage according to an operational current peak of a sense amplifier.

In other words, since several thousand bit line sense amplifiers operate simultaneously when a DRAM operates, the operational time of the bit line sense amplifiers is determined by whether a sufficient current is supplied to the bit line sense amplifiers. However, since the operational voltage of a memory device is low due to the low power consumption requirement, it is difficult to supply a sufficient current simultaneously. To address this, in an overdriving structure of a bit line sense amplifier, a high voltage greater than a normal voltage (generally, an internal core voltage) is momentarily supplied to a bit line sense amplifier power line RTO at an initial operation stage of the bit line sense amplifier (i.e., immediately after a bit line shares a charge with cells).

FIG. 1 is a block diagram of a conventional sense amplifier control circuit for a semiconductor memory device.

Referring to FIG. 1, the conventional semiconductor memory device includes a bank active delay unit 10, a precharge delay unit 12, and an active delay unit 14. The bank active delay unit 10 receives a bank active signal RACT and generates a signal RACTD after a predetermined time from the reception of the bank active signal RACT so as to control an active signal and a precharge signal. The precharge delay unit 12 generates a precharge delay signal PCG_P using the signal RACTD received from the bank active delay unit 10 so as to adjust a delay time in a precharge operation. The active delay unit 14 generates an active delay signal ACT_P using the signal RACTD received from the bank active delay unit 10 so as to adjust a delay time in an active operation.

The conventional sense amplifier control circuit includes a bit line sense amplifier control unit 16 and a sense amplifier driver 18. The bit line sense amplifier control unit 16 generates signals based on signals received from the precharge delay unit 12 and the active delay unit 14 so as to control overdriving or normal driving of a bit line sense amplifier. The sense amplifier driver 18 applies a driving voltage to bit line sense amplifier power lines RTO and SB in response to a signal received from the bit line sense amplifier control unit 16.

The conventional semiconductor memory device operates as follows.

When a control signal RACT providing bank active/precharge information is active, the bank active delay unit 10, the precharge delay unit 12, and the active delay unit 14 delay the control signal RACT for a predetermined time and generate an active delay signal ACT_P for an active operation interval and a precharge delay signal PCG_P for a precharge operation interval.

The bit line sense amplifier control unit 16 controls an operation of the bit line sense amplifier according to the active delay signal ACT_P and the precharge delay signal PCG_P generated by the bank active delay unit 10, the precharge delay unit 12, and the active delay unit 14.

That is, when an active signal is activated, the bit line sense amplifier is controlled to be in an active state (a signal SAN is in a high level). When the active delay signal ACT_P is input to the bit line sense amplifier control unit 16 by delaying the active signal for a predetermined time, the bit line sense amplifier control unit 16 activates an overdriving control signal SAP1 for a predetermined time.

While the overdriving control signal SAP1 is in an activated state, the sense amplifier driver 18 applies an external voltage to the bit line sense amplifier power line RTO (SB). Here, the external voltage has a potential level higher than that of a general core voltage. Therefore, data of memory cells connected to a pair of bit lines BL and BLb can be sensed and amplified more rapidly.

After a voltage level of the bit line pair become higher than a predetermined level, the bit line sense amplifier control unit 16 deactivates the overdriving control signal SAP1 and activates a normal driving control signal SAP2. Thus, a core voltage VCORE can be applied to the bit line sense amplifier power line RTO (SB).

Thereafter, if a precharge signal PCG is activated, the sense amplifier control circuit enables the bit line sense amplifier to be in a deactivated state (the signal SAN is in a low level). The precharge signal PCG is output from the precharge delay unit 12 as a precharge delay signal PCG_P after a predetermined delay time, and the precharge delay signal PCG_P is input to the bit line sense amplifier control unit 16. Then, the normal driving control signal SAP2 is deactivated in response to the precharge delay signal PCG_P.

In this way, during an active operation interval, the conventional sense amplifier control circuit performs a sensing operation by supplying a voltage to a bit line BL and an inverse bit line BLB of the bit line sense amplifier. Here, the sensing operation of the bit line sense amplifier is controlled based on the active delay signal ACT_P and the precharge delay signal PCG_P.

The active delay signal ACT_P and the precharge delay signal PCG_P are generated by delaying the signal RACT containing active/precharge information for a predetermined delay time. That is, the delay time for generating the active delay signal ACT_P and the precharge delay signal PCG_P is fixed.

Therefore, since the conventional sense amplifier control circuit generates the active delay signal ACT_P and the precharge delay signal PCG_P based on a fixed delay time, if the core voltage increases, the delay time can be insufficient, and thus a charging sharing interval of the bit lines BL and BLB can be short. In this case, sensing errors may occur.

That is, during an active operation interval, the conventional sense amplifier control circuit performs a sensing operation for applying high-level and low-level signals to a bit line and an inverse bit line of a bit line sense amplifier after a charge sharing interval during which a potential difference is caused by only cell data. During the charge sharing interval, a potential difference ΔV between the bit line and the inverse bit line is approximately 100 mV. Then, the sensing operation starts in response to a control signal (SAP1, SAP2).

However, if a core voltage level is increased higher than a normal level, a delay time before the sensing operation is shortened and thus a sufficient potential difference ΔV cannot be ensured. In spite of this situation, the sensing operation may start since the signal (SAP1, SAP2) is fixed, thereby increasing sensing errors.

SUMMARY OF THE INVENTION

Embodiments of the present invention are directed to providing a memory device sense amplifier control circuit configured to control a sensing operation start time using a detected core voltage, and a method for controlling the sense amplifier control circuit.

In accordance with an aspect of the present invention, there is provided a sense amplifier control circuit for a memory device, comprising: a level detection unit configured to generate a level detection signal by detecting a core voltage level in an active operation interval; and a control unit configured to generate a pulse signal to control a sensing start time of a bit line detection signal by varying a delay time according to the level detection signal.

In accordance with another aspect of the present invention, there is provided a sense amplifier control circuit for a memory device, comprising: a level detection unit configured to generate a level detection signal by detecting a core voltage level in an active operation interval when a bank active signal is received; an active delay unit configured to generate an active delay signal delayed by a predetermined delay time varying according to the level detection signal; and a bit line sense amplifier control unit configured to control a sensing start time of a bit line sense amplifier according to the active delay signal.

In accordance with another aspect of the present invention, there is provided method for driving a memory device, comprising: outputting a first signal by delaying a bank active signal containing active/precharge information by a predetermined delay time; generating a level detection signal by detecting a core voltage level in an active operation interval; generating an active delay signal delayed by a predetermined delay time varying according to the level detection signal in the active operation interval; generating a precharge delay signal delayed by a predetermined delay time according to the precharge information; and controlling a sensing start time of a bit line sense amplifier according to the active delay signal and operating the bit line sense amplifier until the precharge delay signal is generated.

BRIEF DESCRIPTION OF THE DRAWINGS

FIG. 7 is a timing diagram for illustrating an exemplary operation of the sense amplifier control circuit in accordance with an embodiment of the present invention.

DESCRIPTION OF SPECIFIC EMBODIMENTS

Hereinafter, a sense amplifier control circuit for a semiconductor memory device and a method for controlling the sense amplifier control circuit in accordance with the present invention will be described in detail with reference to the accompanying drawings.

Figure 1:
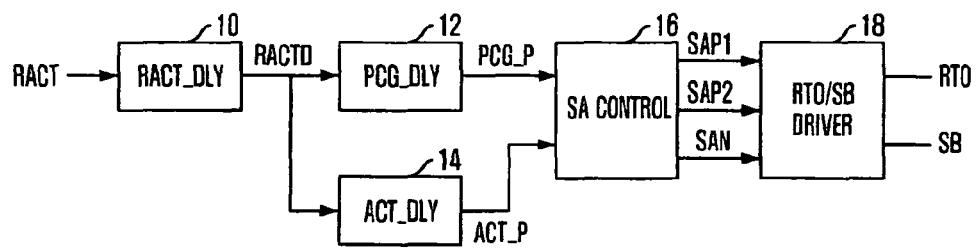
FIG. 1 is a block diagram illustrating a conventional sense amplifier control circuit for a memory device.
Figure 2:
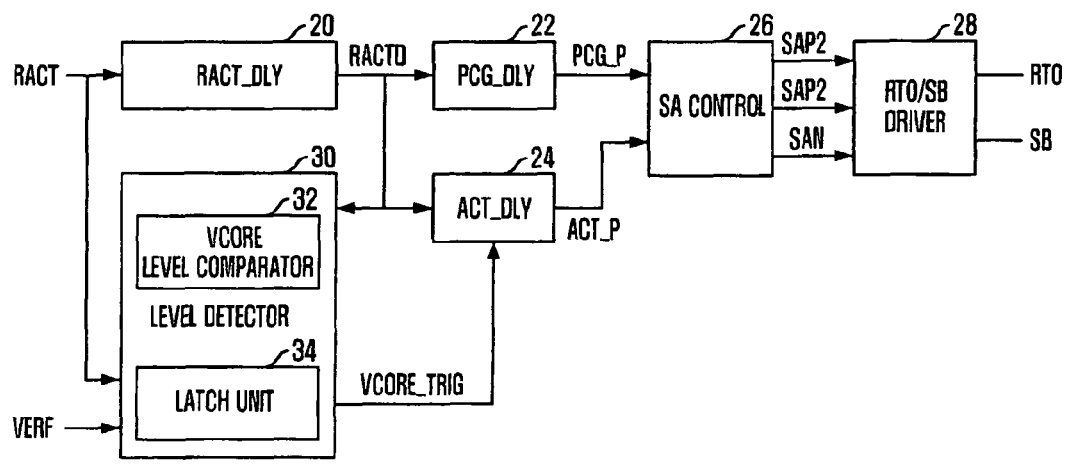
FIG. 2 is a block diagram illustrating a sense amplifier control circuit for a memory device in accordance with an embodiment of the present invention.

FIG. 2 is a block diagram illustrating a sense amplifier control circuit for a memory device in accordance with an embodiment of the present invention.

Referring to FIG. 2, the sense amplifier control circuit in accordance with the current embodiment includes a bank active delay unit 20, a precharge delay unit 22, and an active delay unit 24. The bank active delay unit 20 receives a control signal RACT containing bank active/precharge information and generates a signal RACTD for controlling active and precharge intervals after a predetermined delay time from the reception of the control signal RACT. The precharge delay unit 22 generates a precharge delay signal PCG_P using the signal RACTD received from the bank active delay unit 20 for adjusting a delay time of a precharge operation. The active delay unit 24 generates an active delay signal ACT_P using the signal RACTD received from the bank active delay unit 20 for adjusting a delay time of an active operation. Particularly, in accordance with the current embodiment, the active delay unit 24 is configured to adjust a delay time based on a core voltage level detection signal so that a sufficient delay time can be allowed before a sensing operation.

To this end, the sense amplifier control circuit further includes a level detection unit 30. The level detection unit 30 includes a core voltage level comparator 32 and a latch unit 34. In an active operation interval, the core voltage level comparator 32 detects the level of a core voltage. The latch unit 34 generates a signal VCORE_TRIG using the core voltage level detected by the core voltage level comparator 32 so as to control delaying of the active delay unit 24.

The sense amplifier control circuit further includes a bit line sense amplifier control unit 26 and a sense amplifier driver 28. The bit line sense amplifier control unit 26 controls overdriving and normal driving operations of a bit line sense amplifier by generating signals such as an overdriving control signal SAP1 for generating a power voltage higher than a core voltage based on signals received from the precharge delay unit 22 and the active delay unit 24, a normal driving control signal SAP2 for generating the core voltage after a predetermined time from the generation of the overdriving control signal SAP1, and an operation control signal SAN for controlling overdriving and normal driving operations. The sense amplifier driver 28 applies a driving voltage to bit line sense amplifier power lines RTO and SB in response to a signal received from the sense amplifier control unit 26.

Figure 3:
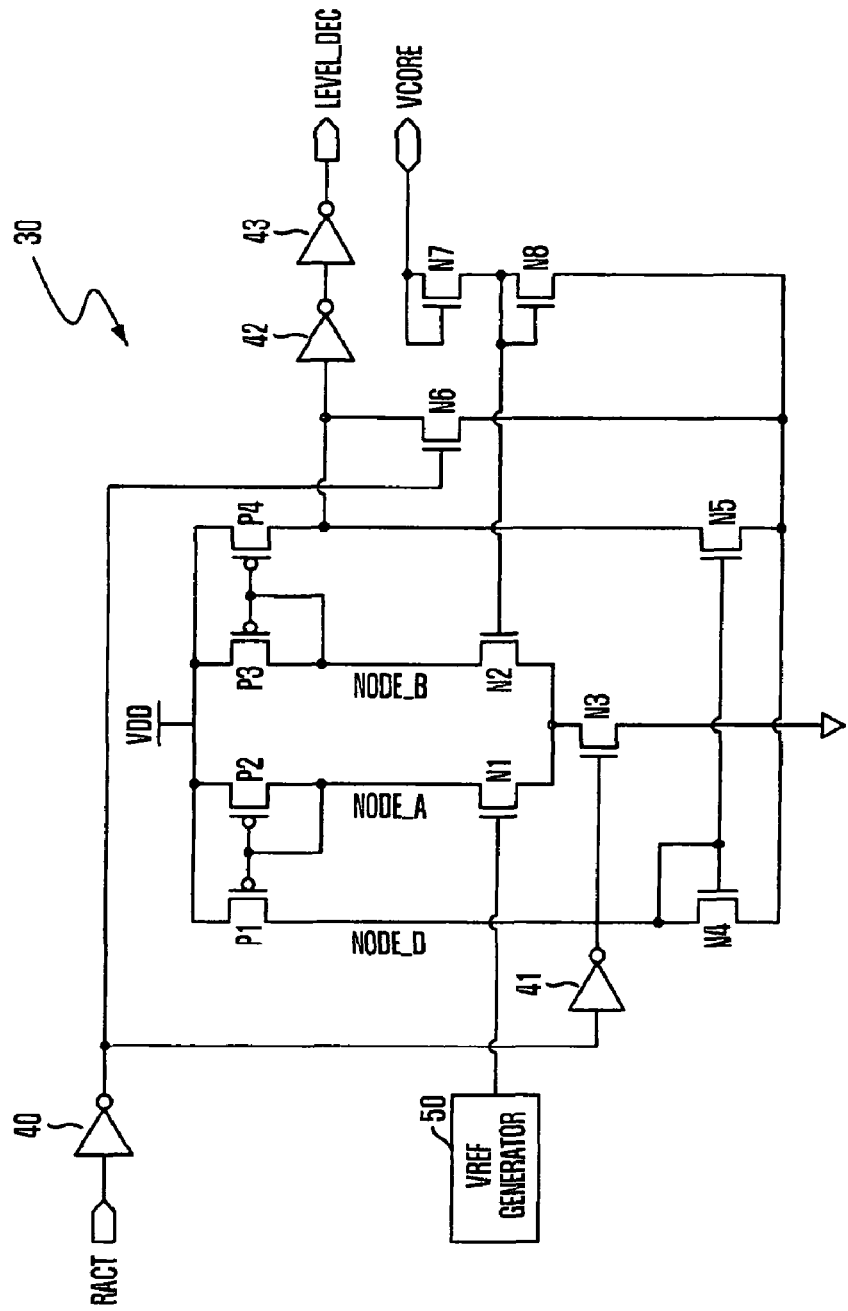
FIG. 3 is a circuit diagram illustrating a core voltage level comparator in accordance with an embodiment of the present invention.

FIG. 3 is a circuit diagram illustrating the core voltage level comparator 32 of the sense amplifier control circuit in accordance with an embodiment of the present invention.

Referring to FIG. 3, in accordance with an embodiment of the present invention, the core voltage level comparator 32 includes a differential comparator, a feedback voltage generator, and an enabling unit. The differential comparator compares a fed-back half core voltage (feedback voltage) having half the voltage level of a core voltage terminal with a reference voltage VREF (set to half the level of a target core voltage). The feedback voltage generator distributes a core voltage and generates a feedback voltage having half the voltage level of the core voltage terminal so as to regulate the core voltage. The enabling unit enables or disables the operation of the differential comparator. The core voltage level comparator 32 further includes a reference voltage generator 50 for generating a reference voltage.

The differential comparator includes two n-channel metal oxide semiconductor (NMOS) transistors N1 and N2 for comparing a reference voltage VREF output from the reference voltage generator 50 with a feedback voltage HVCORE having half the level of a core voltage. Source terminals of the two NMOS transistors N1 and N2 are connected to a common node. A reference voltage VREF is applied to a gate terminal of the NMOS transistor N1, and a feedback voltage HVCORE is applied to a gate terminal of the NMOS transistor N2.

A drain terminal of the NMOS transistor N1 is connected to a p-channel metal oxide semiconductor (PMOS) transistor P2 in series through a node NODE_A, and an external power voltage VDD is applied to a source terminal of the PMOS transistor P2. The PMOS transistor P2 forms a current mirror together with another PMOS transistor P1. The current mirror controls currents of nodes NODE_A and NODE_D.

A drain terminal of the NMOS transistor N2 of the differential comparator is connected to a PMOS transistor P3 in series through a node NODE_B, and the external power voltage VDD is applied to a source terminal of the PMOS transistor P3. The PMOS transistor P3 forms a current mirror together with another PMOS transistor P4. The current mirror controls currents of nodes NODE_B and NODE_C.

An NMOS transistor N4 is connected between the PMOS transistor P1 and a ground voltage, and an NMOS transistor N5 is connected between the PMOS transistor P4 and the ground voltage. The two NMOS transistors N4 and N5 also form a current mirror.

A signal output from an output node NODE_C of the differential comparator is output through inverters 42 and 43 as a core voltage level detection signal LEVEL_DEC.

The enabling unit includes NMOS transistor N3. A drain terminal of the NMOS transistor N3 is connected to the common node of the differential comparator, and a signal RACT is input to a gate terminal of the NMOS transistor N3. A source terminal of the NMOS transistor N3 is connected to the ground voltage. The signal RACT is input to the gate terminal of the NMOS transistor N3 through two inverters 40 and 41. The signal RACT is an operational signal that is enabled when an active signal is input during an active interval and is disabled when a precharge command signal is input. Therefore, the enabling unit operates when the signal RACT is enabled.

The signal RACT is also applied to a gate terminal of an NMOS transistor N6 through the inverter 40. The NMOS transistor N6 selectively mutes a signal of the output node NODE_C of the differential comparator.

The feedback voltage generator includes two NMOS transistors N7 and N8 that are connected in series between an output terminal of a core voltage VCORE and the ground voltage. The gate terminal of the NMOS transistor N2 of the differential comparator is connected to a node between the NMOS transistors N7 and N8. Drain terminals of the NMOS transistors N7 and N8 are connected to gate terminals of the NMOS transistors N7 and N8. Thus, the NMOS transistors N7 and N8 have diode characteristics. Accordingly, the core voltage VCORE is divided by the NMOS transistors N7 and N8, and the divided core voltage VCORE turns on the NMOS transistor N2 of the differential comparator. The NMOS transistors N7 and N8 have the same size and characteristics.

An exemplary operation of the core voltage level comparator 32 will now be described in accordance with an embodiment of the present invention.

The core voltage level comparator 32 starts to operate in response to a signal RACT that is enabled (high level) by an active signal and is disabled (low level) by a precharge command signal. In detail, when the signal RACT is in a high level, the high-level signal is input to the gate terminal of the NMOS transistor N3 to turn on the NMOS transistor N3 and start operation of the differential comparator.

At same time, the high-level signal RACT is inverted to a low-level signal, and the low-level signal is input to the gate terminal of the NMOS transistor N6 such that the NMOS transistor N6 is turned off. Therefore, a signal of the output node NODE_C of the differential comparator can be normally output with no influence from the NMOS transistor N6.

When the signal RACT is enabled, a core voltage VCORE that is actually used in a core region is divided by the NMOS transistors N7 and N8 such that a feedback voltage HVCORE having half the level of the core voltage VCORE can be applied to the differential comparator. Then, the differential comparator compares the feedback voltage HVCORE with a reference voltage VREF. The reference voltage VREF is set to half the level of the core voltage VCORE so as to use the reference voltage VREF for comparison with the actual core voltage VCORE (i.e., the feedback voltage HVCORE).

If the reference voltage VREF and the feedback voltage HVCORE have the same voltage level, the same amount of current flows through the NMOS transistors N1 and N2, and thus the nodes NODE_A and NODE_B of the differential comparator have the same voltage level. The PMOS transistor P4 and the NMOS transistor N5 are configured to have different sizes and characteristics so as to maintain the voltage level of the output node NODE_C at a low level when the nodes NODE_A and NODE_B have the same voltage level as described above. Therefore, if the reference voltage VREF and the feedback voltage HVCORE have the same voltage level, the voltage level of the output node NODE_C is low. That is, the core voltage level detection signal LEVEL_DEC has a low level.

If the feedback voltage HVCORE is lower than the reference voltage VREF, the amount of current IDS flowing through the NMOS transistor N2 is less than the amount of current flowing through the NMOS transistor N1, and thus the voltage level of the node NODE_B is higher than the voltage level of the node NODE_A. Thus, the operating degree of the PMOS transistor P4 is low as compared with the case where the reference voltage VREF and the feedback voltage HVCORE have the same level. On the other hand, the operating degree of the NMOS transistor N5 connected between the PMOS transistor P4 and the ground voltage is relatively high. The reason for this is that when the voltage level of the node NODE_B is high, the voltage level of the node NODE_A is low, and the voltage level of the node NODE_D is high such that a high voltage is applied to the gate terminal of the NMOS transistor N5. Therefore, the voltage level of the node NODE_C is affected by the ground voltage more than by the external power voltage VDD, and thus the voltage level of the node NODE_C is low. That is, the core voltage level detection signal LEVEL_DEC has a low level.

However, if the feedback voltage HVCORE is higher than the reference voltage VREF, the amount of current IDS flowing through the NMOS transistor N2 is larger than the amount of current flowing through the NMOS transistor N1, and thus the voltage level of the node NODE_B is lower than the voltage level of the node NODE_A. Thus, the operating degree of the PMOS transistor P4 become relatively high since the voltage level of the node NODE_B is relatively low. Therefore, the voltage level of the node NODE_C is affected by the external power voltage VDD more than the ground voltage, and thus the voltage level of the node NODE_C is high. That is, the core voltage level detection signal LEVEL_DEC has a high level.

In other words, if the feedback voltage HVCORE is higher than the reference voltage VREF, the core voltage level detection signal LEVEL_DEC has a high level, and if the feedback voltage HVCORE is equal to or lower than the reference voltage VREF, the core voltage level detection signal LEVEL_DEC has a low level.

Figure 4:
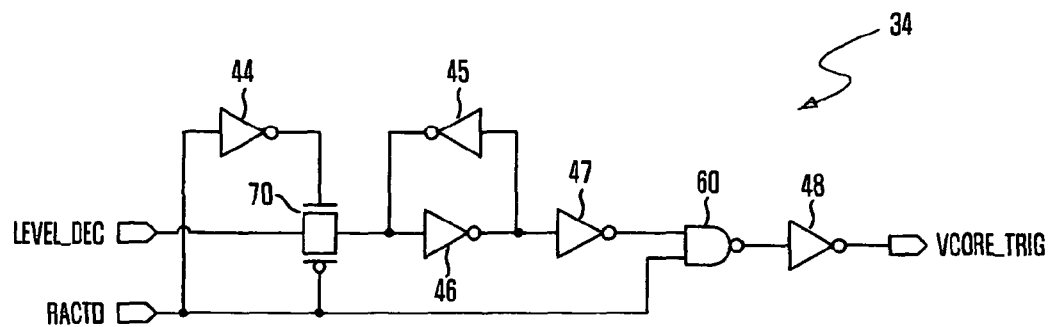
FIG. 4 is a circuit diagram illustrating a latch unit in accordance with an embodiment of the present invention.

FIG. 4 is a circuit diagram illustrating the latch unit 34 of the sense amplifier control circuit in accordance with an embodiment of the present invention.

The latch unit 34 receives a core voltage level detection signal LEVEL_DEC and a signal RACTD generated by delaying a signal RACT that is in an enabled state during an active interval. Then, the latch unit 34 generates a signal VCORE_TRIG using the core voltage level detection signal LEVEL_DEC and the signal RACTD to adjust an active delay time.

For this, the latch unit 34 includes an inverter 44, a transmission gate 70, a latch (45, 46), an inverter 47, a NAND gate 60, and an inverter 48. The inverter 44 inverts a signal RACTD. The transmission gate 70 is on-off controlled by the signal RACTD and the inverted signal RACTD for selectively transmitting a core voltage level detection signal LEVEL_DEC. The latch (45, 46) is used to latch an output signal of the transmission gate 70. The inverter 47 inverts an output signal of the latch (45, 46). The NAND gate 60 receives an output signal of the inverter 47 and the signal RACTD for NAND operation. The inverter 48 outputs a signal VCORE_TRIG by inverting an output signal of the NAND gate 60.

That is, the latch unit 34 generates a signal VCORE_TRIG using a core voltage level detection signal LEVEL_DEC of the core voltage level comparator 32 and a signal RACTD.

The signal RACTD is a signal generated by delaying a signal RACT (a bank active signal).

The core voltage level detection signal LEVEL_DEC (refer to FIG. 3) generated through a comparison operation in response to a signal RACT is transferred to the transmission gate 70 before the signal RACTD is transferred to the transmission gate 70.

When the signal RACTD is in a disabled state (i.e., a low-level state), the transmission gate 70 is kept at a turned-on state. The moment when the signal RACTD is enabled (i.e., the moment when the signal RACTD changes to a high level state), the transmission gate 70 is turned off. The core voltage level detection signal LEVEL_DEC can pass through the transmission gate 70 selectively by on-off controlling the transmission gate 70 as described above. Then, the core voltage level detection signal LEVEL_DEC is latched.

A signal transmitted through the latch (45, 46) is input to the NAND gate 60 through the inverter 47. Then, the NAND gate 60 synchronize the signal with the signal RACTD.

Therefore, during a precharge interval, the signal RACTD is disabled to a low level. In this case, the level of the signal VCORE_TRIG output from the latch unit 34 is always low regardless of the level of the core voltage level detection signal LEVEL_DEC input to the NAND gate 60.

However, during an active interval, the signal RACTD is enabled to a high level such that the level of the signal VCORE_TRIG output from the latch unit 34 varies according to the level of the core voltage level detection signal LEVEL_DEC input to the NAND gate 60.

Therefore, during the active interval, the level of the signal VCORE_TRIG is low if the level of the core voltage level detection signal LEVEL_DEC is low and is high if the level of the core voltage level detection signal LEVEL_DEC is high. That is, when the level of a feedback voltage HVCORE is equal to or lower than the level of the reference voltage VREF, the level of the signal VCORE_TRIG is low, and when the level of the feedback voltage HVCORE is higher than the level of the reference voltage VREF, the level of the signal VCORE_TRIG is high.

Figure 5:
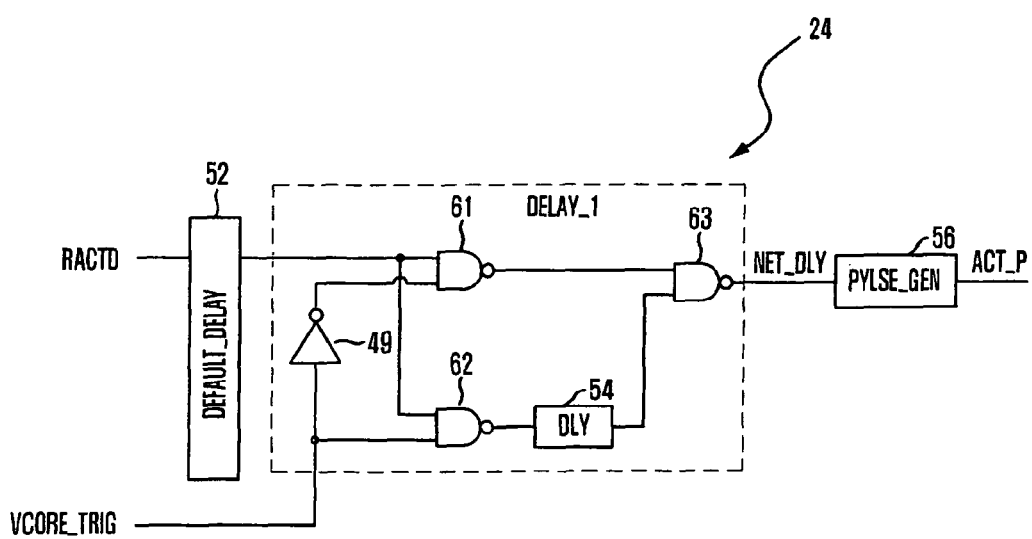
FIG. 5 is a circuit diagram illustrating an active delay unit in accordance with an embodiment of the present invention.

FIG. 5 is a circuit diagram illustrating the active delay unit 24 of the sense amplifier control circuit in accordance with an embodiment of the present invention.

The active delay unit 24 has a structure similar to a conventional active delay device. That is, the active delay unit 24 includes a default delay unit 52, an inverter 49, a NAND gate 61, a NAND gate 62, a delay unit 54, a NAND gate 63, and a pulse generator 56. The default delay unit 52 delays a signal RACT by a minimal delay time. The inverter 49 inverts a signal VCORE_TRIG received from the latch unit 34. The NAND gate 61 receives signals output from the inverter 49 and the default delay unit 52 for NAND operation. The NAND gate 62 receives a signal output from the default delay unit 52 and a signal VCORE_TRIG output from the latch unit 34 for NAND operation. The delay unit 54 delays a signal output from the NAND gate 62 by a predetermined time. The NAND gate 63 receives signals output from the delay unit 54 and the NAND gate 61 for NAND operation. The pulse generator 56 generates a pulse signal based on a signal output from the NAND gate 63.

The active delay unit 24 operates as follows.

If the level of a core voltage VCORE is equal to or lower than a target level, a signal VCORE_TRIG output from the latch unit 34 has a low level (refer to FIG. 4). In this case, the signal VCORE_TRIG output from the latch unit 34 does not affect the active delay unit 24.

That is, since the low-level signal VCORE_TRIG output from the latch unit 34 is inverted to a high level signal by the inverter 49 and is input to the NAND gate 61, the NAND gate 61 is not affected by the low-level signal VCORE_TRIG output from the latch unit 34. The NAND gate 62 outputs a high-level signal in response to the low-level signal VCORE_TRIG output from the latch unit 34, and the high-level signal is input to the NAND gate 63 through the delay unit 54 such that the NAND gate 63 is not affected by the low-level signal VCORE_TRIG output from the latch unit 34. Therefore, the NAND gate 63 outputs a signal that is once delayed by the default delay unit 52.

Therefore, if the level of a core voltage VCORE is equal to or lower than a target level, a signal RACTD is delayed by the default delay unit 52 by a minimal delay time and passes through the NAND gate 61 and the NAND gate 63 without being additionally delayed. Then, like in the case of the conventional active delay unit 14, an active delay signal ACT_P (a pulse signal) is output from the pulse generator 56 of the active delay unit 24 in response to the signal RACTD output from the NAND gate 63.

If the level of a core voltage VCORE is higher than a target level, a signal VCORE_TRIG output from the latch unit 34 has a high level (refer to FIG. 4).

In this case, the high-level signal VCORE_TRIG output from the latch unit 34 is inverted to a low level signal by the inverter 49 and is input to the NAND gate 61, and then the NAND gate 61 outputs a high-level signal in response to the low-level signal. Then, the high-level signal is input to the NAND gate 63. However, the NAND gate 63 is not affected by the high-level signal.

Meanwhile, the NAND gate 62 receives the high-level signal VCORE_TRIG output from the latch unit 34 and a signal output from the default delay unit 52 and outputs the signal received from the default delay unit 52. The signal output from the NAND gate 62 is further delayed by the delay unit 54 and is input to the NAND gate 63. That is, the NAND gate 63 outputs a signal that is twice delayed by the default delay unit 52 and the delay unit 54.

Therefore, if the level of a core voltage VCORE is higher than a target level, a signal RACTD is delayed by the default delay unit 52 by a minimal delay time and passes through the NAND gate 62 and the delay unit 54. While the signal RACTD passes through the delay unit 54, the signal RACTD is additionally delayed, and the NAND gate 63 transmits the additionally delayed signal RACTD. Then, the pulse generator 56 generates an active delay signal ACT_P (a pulse signal) in response to the additionally delayed signal output from the NAND gate 63.

That is, if the level of a core voltage VCORE is equal to or lower than a target level, an active delay signal ACT_P that is delayed by a default delay time is output for bit line (BL, BLB) sensing operation. On the other hand, if the level of the core voltage VCORE is higher than the target level, an active delay signal ACT_P that is delayed more than the default delay time is output. Therefore, a sufficient delay time can be allowed before the bit line sensing operation.

Figure 6:
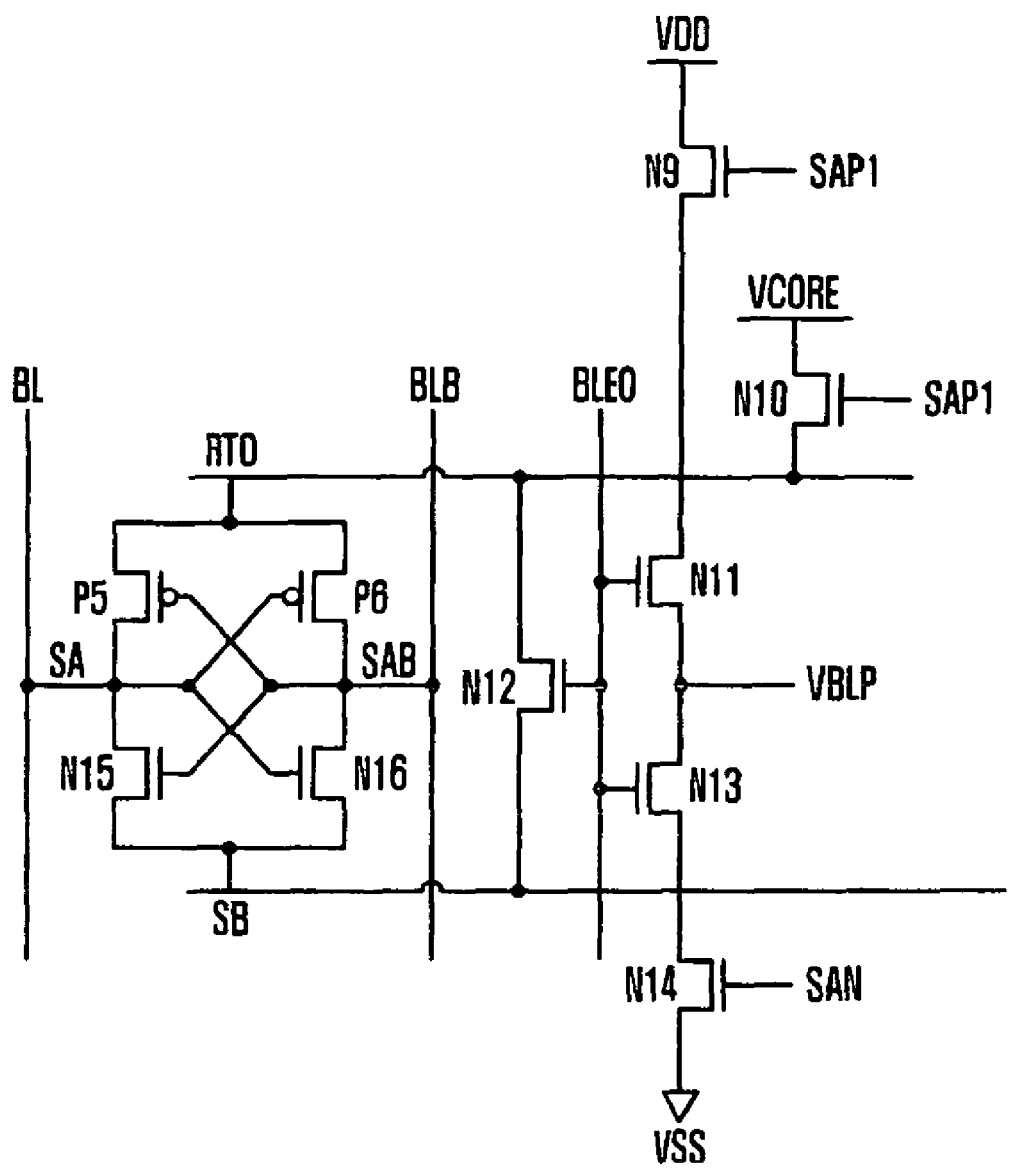
FIG. 6 is a circuit diagram illustrating a bit line sense amplifier driver in accordance with an embodiment of the present invention.

FIG. 6 is a circuit diagram illustrating the sense amplifier driver 28 of the sense amplifier control circuit in accordance with an embodiment of the present invention.

Referring to FIG. 6, the sense amplifier driver 28 supplies a power voltage to a bit line sense amplifier (P5, P6, N15, N16) of a bit line sense amplifier array through the bit line sense amplifier power line RTO. In a normal sensing operation, an NMOS transistor N10 is turned on by a normal driving control signal SAP2, and thus a core voltage VCORE is input to the bit line sense amplifier (P5, P6, N15, N16) through the bit line sense amplifier power line RTO. In an initial sensing operation, an NMOS transistor N9 is turned on by an overdriving control signal SAP1 such that a power voltage VDD higher than the core voltage VCORE is input to the bit line sense amplifier (P5, P6, N15, N16) through the bit line sense amplifier power line RTO so as to accelerate the initial sensing operation. NMOS transistors N11, N12, and N13 form a precharge unit for a precharge operation of the bit line sense amplifier (P5, P6, N15, N16). An operation control signal SAN is used to control operation of a NMOS transistor N14. The NMOS transistor N14 is used to close and open a current path to the precharge unit and a supply power driving unit.

FIG. 7 is a timing diagram for illustrating exemplary operations of the components of the sense amplifier control circuit in accordance with an embodiment of the present invention. An exemplary overall operation of the sense amplifier control circuit of FIG. 2 will now be described with reference to FIG. 7.

In an active interval, a control signal RACT containing bank active/precharge information is activated. The control signal RACT is delayed by the bank active delay unit 20 by a predetermined delay time and is output from the bank active delay unit 20 as a signal RACTD. The control signal RACT is also input to the level detection unit 30.

The control signal RACT input to the level detection unit 30 controls the core voltage level comparator 32 such that the core voltage level comparator 32 can detect and output a core voltage level in the active interval. That is, when the control signal RACT is in an enabled state, the core voltage level comparator 32 detects the core voltage level by comparing the voltage level of a core voltage terminal with a reference voltage level.

If the core voltage level is higher than the reference voltage level, a core voltage level detection signal LEVEL_DEC is in a high-level state. If the core voltage level is equal to or lower than the reference voltage level, the core voltage level detection signal LEVEL_DEC is in a low-level state.

A core voltage level detection signal LEVEL_DEC output from the core voltage level comparator 32 is input to the latch unit 34. When the control signal RACT is enabled and the core voltage level detection signal LEVEL_DEC has a low level, the latch unit 34 outputs a signal VCORE_TRIG having a low level. On the other hand, when the control signal RACT is enabled and the core voltage level detection signal LEVEL_DEC has a high level, the latch unit 34 a signal VCORE_TRIG having a high level.

That is, when the (feedback) core voltage level is equal to or lower than the reference voltage level, the signal VCORE_TRIG has a low level, and when the feedback core voltage level is higher than the reference voltage level, the signal VCORE_TRIG has a high level.

The signal VCORE_TRIG output from the latch unit 34 is input to the active delay unit 24. The active delay unit 24 generates a pulse signal (an active delay signal ACT_P) by delaying the signal RACTD based on the signal VCORE_TRIG.

That is, when the signal VCORE_TRIG output from the latch unit 34 has a low level, the active delay unit 24 delays the signal RACTD by a preset delay time of the default delay unit 52 and generates a pulse signal. On the other hand, when the signal VCORE_TRIG output from the latch unit 34 has a high level, the active delay unit 24 delays the signal RACTD by the preset delay time of the default delay unit 52 and a preset delay time of the delay unit 54. Then, the active delay unit 24 generates a pulse signal.

In other words, when the feedback core voltage level is equal to or lower than the reference voltage, the active delay unit 24 generates a pulse signal (an active delay signal ACT_P) after a preset delay time of the default delay unit 52. When the feedback core voltage level is higher than the reference voltage, the active delay unit 24 generates a pulse signal (an active delay signal ACT_P) after a preset delay time of the default delay unit 52 and a preset delay time of the delay unit 54.

The sense amplifier control unit 26 controls operation of the bit line sense amplifier based on a precharge delay signal PCG_P output from the precharge delay unit 22 and an active delay signal ACT_P of the active delay unit 24.

That is, when an active signal is enabled, the sense amplifier control unit 26 controls the bit line sense amplifier to be in an activated state (an operation control signal SAN has a high-level). When an active delay signal ACT_P generated by delaying the active signal is input to the sense amplifier control unit 26, the sense amplifier control unit 26 activates an overdriving control signal SAP1 for a predetermined time interval.

While the overdriving control signal SAP1 is in an activated state, the sense amplifier driver 28 applies an external voltage to the bit line sense amplifier power line RTO (SB). Here, the external voltage is higher than a general core voltage. Therefore, data of memory cells connected to a pair of bit lines BL and BLB can be sensed and amplified more rapidly.

After the voltage level of the bit lines BL and BLB increases higher than a predetermined level, the sense amplifier control unit 26 deactivates the overdriving control signal SAP1 and activates a normal driving control signal SAP2. Therefore, a core voltage VCORE can be applied to the bit line sense amplifier power line RTO (SB).

Thereafter, when a precharge signal PCG is activated, the sense amplifier control circuit controls the bit line sense amplifier to be in a deactivated state (the operation control signal SAN has a low level). The precharge signal PCG is delayed by the precharge delay unit 22 by a predetermined delay time and is input to the sense amplifier control unit 26 as a precharge delay signal PCG_P, and then the normal driving control signal SAP2 is deactivated in response to the precharge delay signal PCG_P.

In accordance with the present invention, if the level of a core voltage is high, a sensing operation starts after a sufficient delay time. That is, in accordance with the present invention, when the core voltage level is higher than a normal core voltage level, the sensing operation starts after a sufficient delay time so as to ensure a sufficient potential difference ΔV between bit lines BL and BLB. Therefore, although the core voltage level increases higher than a normal level, sensing errors are not increased, and thus reliable products can be provided.

The present invention has been described with respect to the specific embodiments, which are for illustrative purposes only and are not intended to limit the scope of the present invention. According to the present invention, sensing start time of a bit line sense amplifier can be adjusted according to the level of a core voltage. It will be apparent to those skilled in the art that various changes and modifications may be made without departing from the spirit and scope of the invention as defined in the following claims.

What is claimed is:

1. A sense amplifier control circuit for a memory device, comprising:
   a level detection unit configured to generate a level detection signal by detecting a core voltage level in an active operation interval when a bank active signal is received; and
   a control unit configured to generate a pulse signal to control a sensing start time of a bit line detection signal by varying a delay time according to the level detection signal.

2. The sense amplifier control circuit of claim 1, wherein the level detection unit comprises:
   a core voltage level comparator configured to generate the level detection signal by detecting the core voltage level during the active operation interval; and
   a latch unit configured to latch the level detection signal during the active operation interval.

3. The sense amplifier control circuit of claim 2, wherein the control unit comprises:
   a bank active delay unit configured to delay a signal providing bank active/precharge information and output the delayed signal;
   a precharge delay unit configured to generate a precharge delay signal delayed by a predetermined delay time based on the precharge information included in the delayed signal;
   an active delay unit configured to generate an active delay signal delayed by a predetermined delay time, the predetermined delay time varying according to the bank active information and the level detection signal; and
   a bit line sense amplifier control unit configured to control a bit line sense amplifier to start a sensing operation in response to the active delay signal and configured to enable the bit line sense amplifier until the precharge delay unit generates the precharge delay signal.

4. The sense amplifier control circuit of claim 3, further comprising:
   a bit line sense amplifier driver configured to drive the bit line sense amplifier under control of the bit line sense amplifier control unit.

5. The sense amplifier control circuit of claim 2, wherein the core voltage level comparator comprises a differential comparator configured to compare a core voltage with a reference voltage and generate an enabled core voltage level detection signal when the core voltage is higher than the reference voltage.

6. The sense amplifier control circuit of claim 2, wherein the core voltage level comparator comprises a differential comparator configured to compare a core voltage with a reference voltage and generate a disabled core voltage level detection signal when the core voltage is equal to or lower than the reference voltage.

7. The sense amplifier control circuit of claim 2, wherein the latch unit comprises:
   a switching unit configured to switch the level detection signal;
   a latch configured to latch the level detection signal;
   an inverter configured to invert a signal output from the latch; and
   a NAND gate configured to output a signal of the inverter during the active operation interval.

8. The sense amplifier control circuit of claim 1, wherein the level detection unit comprises a comparator configured to compare a core voltage with a reference voltage and generate an enabled core voltage level detection signal when the core voltage is higher than the reference voltage.

9. The sense amplifier control circuit of claim 1, wherein the level detection unit comprises a comparator configured to compare a core voltage with a reference voltage and generate a disabled core voltage level detection signal when the core voltage is equal to or lower than the reference voltage.

10. A sense amplifier control circuit for a memory device, comprising:
   a level detection unit configured to generate a level detection signal by detecting a core voltage level in an active operation interval when a bank active signal is received;
   an active delay unit configured to generate an active delay signal delayed by a predetermined delay time varying according to the level detection signal; and
   a bit line sense amplifier control unit configured to control a sensing start time of a bit line sense amplifier according to the active delay signal.

11. The sense amplifier control circuit of claim 10, wherein the level detection unit comprises:
   a core voltage level comparator configured to generate a level detection signal by detecting a core voltage level during the active operation interval; and
   a latch unit configured to latch the level detection signal during the active operation interval.

12. The sense amplifier control circuit of claim 11, further comprising a precharge delay unit configured to generate a precharge delay signal delayed by a predetermined delay time according to precharge information, wherein the bit line sense amplifier control unit controls the bit line sense amplifier until the precharge delay unit generates the precharge delay signal.

13. The sense amplifier control circuit of claim 10, wherein the active delay unit comprises:
   a first delay unit configured to delay a first level detection signal generated when a core voltage is equal to or lower than a target voltage level; and
   a second delay unit configured to delay a second level detection signal generated when a core voltage is higher than a target voltage level.

14. The sense amplifier control circuit of claim 13, wherein the second delay unit has a longer delay time than that of the first delay unit.

15. The sense amplifier control circuit of claim 14, wherein the second delay unit comprises a delay portion configured to additionally delay a signal output from the first delay unit by a predetermined delay time.

16. The sense amplifier control circuit of claim 13, wherein the bit line sense amplifier control unit comprises a pulse generator configured to generate a pulse signal according to a signal output from the first delay unit or the second delay unit.

17. A sense amplifier control circuit for a memory device, comprising:
   a level detection unit configured to generate a level detection signal by detecting a core voltage level during an active operation interval when a bank active signal is received;
   an active delay unit configured to generate an active delay signal having a varying delay time according to the level detection signal;
   a precharge delay unit configured to generate a precharge delay signal delayed by a predetermined delay time according to the precharge information;
   a bit line sense amplifier control unit configured to control a sensing start time of a bit line sense amplifier according to the active delay signal and configured to control an enabling operation of the bit line sense amplifier until the precharge delay unit generates the precharge delay signal; and
   a bit line sense amplifier driver configured to drive the bit line sense amplifier under control of the bit line sense amplifier control unit.

18. The sense amplifier control circuit of claim 17, wherein the level detection unit comprises:
   a core voltage level comparator configured to generate a level detection signal by detecting a core voltage level during the active operation interval when a bank active signal is received; and
   a latch unit configured to latch the level detection signal during the active operation interval.

19. The sense amplifier control circuit of claim 17, wherein the active delay unit comprises:
   a first delay unit configured to delay an active signal by a predetermined delay time;
   a second delay unit configured to receive a signal output from the first delay unit and delay the received signal by a predetermined delay time;
   a first switching unit configured to allow the first delay unit to output a signal in response to a first level detection signal generated when a core voltage is equal to or lower than a target voltage level; and
   a second switching unit configured to allow the second delay unit to output a signal in response to a second level detection signal generated when the core voltage is higher than the target voltage level.

20. The sense amplifier control circuit of claim 19, wherein the active delay unit further comprises a pulse generator configured to generate a pulse signal according to outputs of the first and second switching units.

21. A method for driving a memory device, comprising:
   outputting a first signal by delaying a bank active signal containing active/precharge information by a predetermined delay time;
   generating a level detection signal by detecting a core voltage level during an active operation interval;
   generating an active delay signal delayed by a predetermined delay time varying according to the level detection signal during the active operation interval;
   generating a precharge delay signal delayed by a predetermined delay time according to the precharge information; and
   controlling a sensing start time of a bit line sense amplifier according to the active delay signal and operating the bit line sense amplifier until the precharge delay signal is generated.

22. The method of claim 21, wherein the generating of the active delay signal comprises:
   generating a first active delay signal delayed by a first delay time according to a level detection signal detected when a core voltage is higher than a target voltage level; and
   generating a second active delay signal delayed by a second delay time according to a level detection signal detected when the core voltage is equal to or lower than the target voltage level.

* * * * *